(12) United States Patent
Yang

(10) Patent No.: US 7,016,823 B2
(45) Date of Patent: Mar. 21, 2006

(54) METHOD FOR SIMULATING A MIXER IN CIRCUIT SIMULATORS AND THE LIKE

(75) Inventor: Jianjun Yang, Essex Junction, VT (US)

(73) Assignee: Agilent Technologies, Inc., Palo Alto, CA (US)

( * ) Notice: Subject to any disclaimer, the term of this patent is extended or adjusted under 35 U.S.C. 154(b) by 849 days.

(21) Appl. No.: 10/062,626

(22) Filed: Jan. 30, 2002

(65) Prior Publication Data

US 2003/0144827 A1    Jul. 31, 2003

(51) Int. Cl.
*G06F 9/455*    (2006.01)
*G06N 7/00*    (2006.01)

(52) U.S. Cl. ............................. 703/2; 703/14; 375/268

(58) Field of Classification Search ................ 381/119; 324/76.23, 76.41; 703/14, 2; 708/190, 271, 708/317; 375/268; 332/150
See application file for complete search history.

(56) References Cited

U.S. PATENT DOCUMENTS

| | | | | |
|---|---|---|---|---|
| 4,716,537 | A | * | 12/1987 | Scheuermann ............... 708/317 |
| 5,808,915 | A | * | 9/1998 | Troyanovsky ................. 703/14 |
| 6,188,974 | B1 | * | 2/2001 | Cullum et al. ................. 703/14 |
| 6,349,272 | B1 | * | 2/2002 | Phillips .......................... 703/2 |

OTHER PUBLICATIONS

Ken Kundert, "Simulation Methods for RF Integrated Circuits", 1997, IEEE, p. 752-765.*
Danial Faria, Lawrence Dunleavy, and Terje Svensen; "The Use of Intermodulation Tables for Mixer Simulations", 2002, Microwave Journal, p. 1-6.*
Iason Vassilou and Alberto Sangiovanni-Vincentelli, "A Frequency-Domain, Volterra Series-Based Behavioral Simulation Tool for RF Systems", 1999, pp. 21-24.*
Kartikeya Mayaram, David C. Lee, Shahriar Moinian, David A. Rich, and Jaijeet Roychowdhury; "Computer-Aided Circuit Analysis Tools for RFIC Simulation: Algorithms, Features, and Limitations"; 2000, IEEE, pp. 274-286.*
T. Wang and T. Brazil, "The Estimation of Volterra Transfer Functions with Applications to RF Power Amplifier Behavior Evaluation for CDMA Digital Communication", 2000, IEEE, pp. 425-428.*
I. Vassiliou and A. Sangiovanni-Vincentelli, "A Frequency-Domain, Volterra Series-Based Behavioral Simulation Tool for RF Systems", 1999, IEEE, pp. 21-24.*
Agilent Technologies, "Advanced Design System 1.5, Circuit Components Systems Models", Feb. 2001, chapters 1-9 and index.*

* cited by examiner

*Primary Examiner*—Paul L. Rodriguez
*Assistant Examiner*—Jason Proctor

(57) ABSTRACT

A method for operating a data processing system to simulate a mixer having an RF port, a LO port, and an IF port. In the present invention, the signal leaving the IF port is approximated by:

$$b2 = f(a1,a3) + S22 * a2$$

where S22 is a constant, a2 is a signal input to the IF port, a1 is a signal input to said RF port and a3 is a signal input to said LO port, and $$f(a1, a3) = \sum_{i=o}^{M} \sum_{j=o}^{N} C_{ij} * a1^i * a3^j$$

The coefficients $C_{ij}$ are constants that depend on said mixer design. These coefficients can be determined by measuring the b2 when a1 and a3 are single tone signals. In addition, the coefficients can be determined by simulating said mixer on a non-linear circuit simulator when a1 and a3 are single tone signals.

3 Claims, 1 Drawing Sheet

METHOD FOR SIMULATING A MIXER IN CIRCUIT SIMULATORS AND THE LIKE

FIELD OF THE INVENTION

The present invention relates to circuit simulators, and more particularly, to an improved method for simulating mixers.

BACKGROUND OF THE INVENTION

Mixers are at the heart of radio transmitters and receivers. A mixer ideally combines the signals from two frequency sources to generate an output signal having the sum and differences of the input frequencies. In practice, mixers also generate signals at spurious frequencies.

Modern radio designers typically utilize circuit simulators in the design of circuits that utilize mixers. However, a satisfactory model for representing mixers in such simulators is not available. At present, mixers are simulated utilizing mixer Inter-Modulation Table (IMT) methods. The existing mixer IMT models map each input frequency to multiple output frequencies using a table look-up approach. The mixer IMT data can be measured with a spectrum analyzer, or be generated with a nonlinear circuit simulator for any particular mixer design.

This approach has several drawbacks. It is not applicable to time domain simulators. In addition, it does not model adjacent channel power in circuit envelope simulators. Further, it does not model inter-modulation among multiple input tones in harmonic balance simulators. Finally, it does not model noise mapping in harmonic balance simulators and circuit envelope simulators.

Broadly, it is the object of the present invention to provide an improved method for modeling mixers that is applicable to a wider range of simulators than the existing mixer IMT models.

These and other objects of the present invention will become apparent to those skilled in the art from the following detailed description of the invention and the accompanying drawings.

SUMMARY OF THE INVENTION

The present invention provides a method for operating a data processing system to simulate a mixer having an RF pen, a LO port, and an if port. In the present invention, the signal leaving the IF port is approximated by the equation $$b2=f(a1,a3)+S22*a2$$

where S22 is a constant, a2 is a signal input to the IF port, a1 is a signal input to said RF port and a3 is a signal input to said LO port, and $$f(a1, a3) = \sum_{i=o}^{M} \sum_{j=o}^{N} C_{ij} * aI^i * a3^j$$

The coefficients $C_{ij}$ are constants that depend on said mixer design. These coefficients can be determined by measuring the b2 when a1 and a3 are single tone signals. In addition, the coefficients can be determined by simulating said mixer on a non-linear circuit simulator when a1 and a3 are single tone signals.

DETAILED DESCRIPTION OF THE INVENTION

Figure 1:
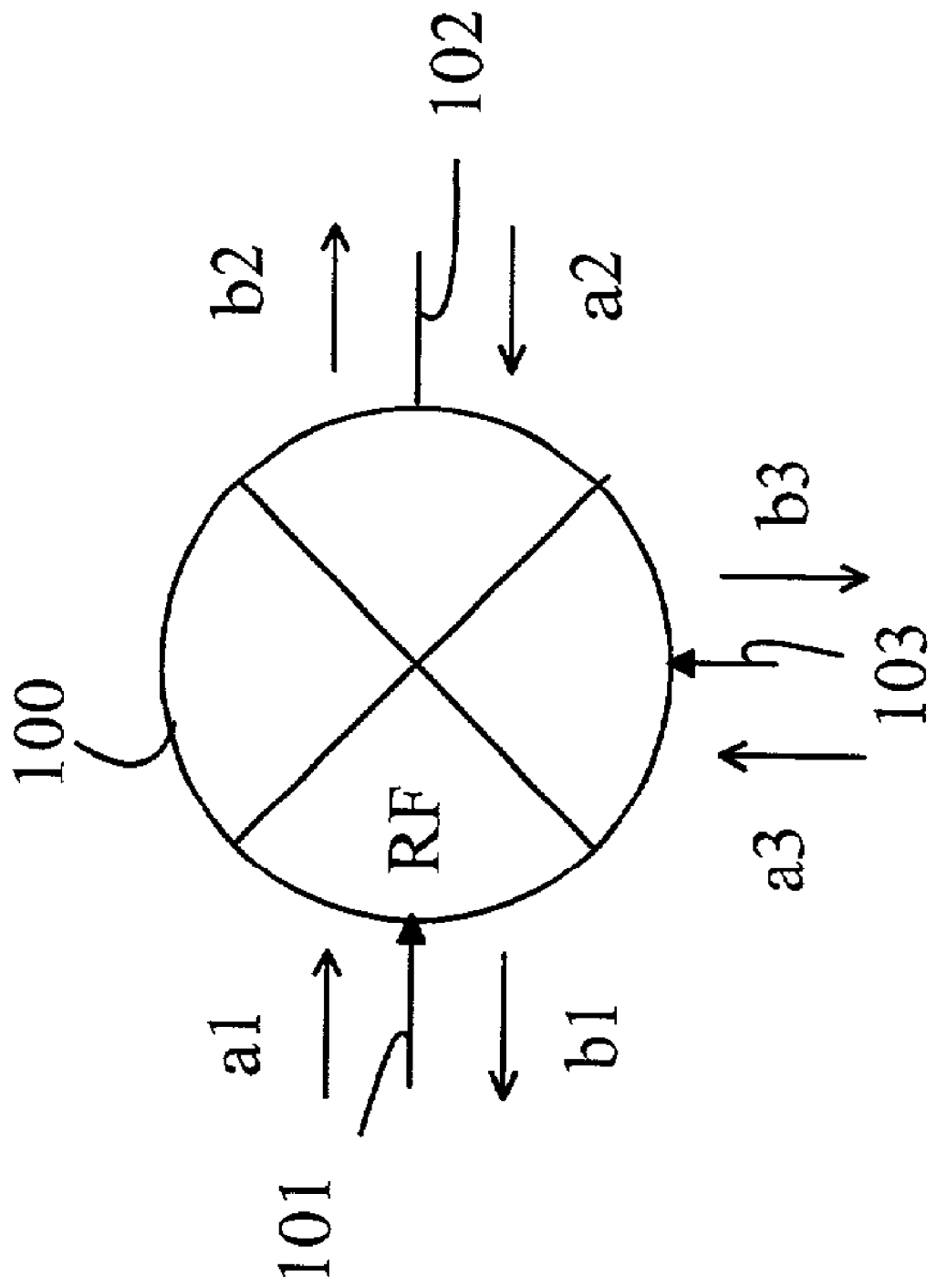
FIG. 1 illustrates the signals associated with a mixer 100.

The manner in which the present invention represents a mixer can be more easily understood with reference to FIG. 1, which illustrates the signals associated with a mixer 100. In general, the mixer receives inputs a1 and a3, on the RF port 101 and the LO port 103. The mixer generates a signal b2 on the IF pen 102 of the mixer. A circuit simulator must be able to compute the signals b1–b3 from the various input signals. The present invention models the relevant signals as follows:

$$b1=S11*a1$$

$$b2=f(a1,a3)+S22*a2$$

$$b3=S33*a3$$

where:

$$f(aI, a3) = \sum_{i=o}^{M} \sum_{j=o}^{N} C_{ij} * aI^i * a3^j \quad (1)$$

Here, S11, S22, and S33 are constants determined by a vector network analyzer measurement or by an S-parameter simulator.

Consider the case in which the incident waves at the RF port and the LO port are single sinusoidal tones, i.e., $$a1=A*\cos w_1 t$$

$$a3=B*\cos w_2 t \quad (2)$$

and there is no signal incident on the IF port. The output of the IF port generated by the present invention will be:

$$\begin{aligned} f(a1,a3) &= a_{00}+a_{01}\cos(w_2 t)+a_{02}\cos(2w_2 t)+\ldots +a_{0N} \\ &\cos(Nw_2 t)+a_{10}\cos(w_1 t)+a_{11}\cos(w_1 \pm w_2 t)+a_{12} \\ &\cos(w_1 \pm 2w_2 t)+\ldots +a_{1N}\cos(w_1 \pm Nw_2 t)+a_{20}\cos \\ &(2w_1 t)+a_{21}\cos(2w_1 \pm w_2 t)+a_{22}\cos(2w_1 \pm 2w_2 t)+\ldots \\ &\ldots +a_{2N}\cos(2w_1 \pm Nw_2 t)+\ldots a_{M0}\cos(Mw_1 t)+a_{M1} \\ &\cos(Mw_1 \pm w_2 t)+a_{M2}\cos(Mw_1 \pm 2w_2 t)+\ldots +a_{MN} \\ &\cos(Mw_1 \pm Nw_2 t) \end{aligned} \quad (3)$$

It can be seen from this expansion, that the present invention models the mixing products generated by the mixer at all frequencies m*RF+n*LO with (−M≦m≦M, −N≦n≦N). Here, the $a_{ij}$ are entries in the conventional IMT. That is, each coefficient represents the voltage-wave magnitude that determines the actual output power level of a mixing product, under a particular set of input frequency and power conditions.—The coefficients $a_{ij}$ can be measured for any given mixer design using a spectrum analyzer.

Given the IMT coefficients, $a_{ij}$, the model's coefficients $C_{ij}$ can be computed by solving a set of linear equations obtained by comparing Eqs (1) and (3) with the substitution shown in Eq. (2). Since such computations are conventional in the art they will not be discussed in detail. For the purpose of the present discussion, a specific example will be given to clarify one method for performing the solution. However, other methods will be apparent to those skilled in the art.

To determine the model coefficients $C_{ij}$ (i=0 ... M, j=0, ... N) from the IMT, one needs to solve following algebra equation:

$$[F]K \times K[C]K \times 1 = [a]K \times 1$$

with $K=(M+1)*(N+1)$, $C_k = C_{ij}$, $a_k = a_{ij}$, $k=i+j*(N+1)$, $0 \leq i \leq M$, $0 \leq j \leq N$ Here, $a_{ij}$ is the $ij^{th}$ entry of the mixer IMT data matrix. [F] is the coefficient matrix. [F] may be computed from a characteristic matrix [T] M×M as follows. For most practical mixer applications, M=15 is sufficient.

Given T, the elements of the matrix [F] are computed from $$F_{kl} = T_{im} * T_{jn}$$

where, K,l,i,j satisfy:

$k=i+j*(N+1)$, $0 \leq i \leq M$, $0 \leq j \leq N$ $l=m+n*(N+1)$, $0 \leq m \leq M$, $0 \leq n \leq N$ It should be noted that [F] is an upper-triangular matrix; hence, [C] can be determined by back-substitution.

The above example assumes that the inputs to the RF and LO inputs are single tones. However, the present invention can also be utilized with more complex input signals such as modulation signals. In this case, a1 and a3 will be more complex time domain signals rather than sinusoidal signals.

The present invention is preferably implemented as part of a circuit simulator running on a general purpose data processing system. However, the invention may be operated as part of any program that is required to model a mixer circuit. Similarly, the present invention may be operated on a wide variety of computational platforms including systems having specialized hardware.

The mixer model of the present invention can, in principle, be utilized in a time-domain model and produce results in time or frequency domain.

Various modifications to the present invention will become apparent to those skilled in the art from the foregoing description and accompanying drawings. Accordingly, the present invention is to be limited solely by the scope of the following claims.

What is claimed is:

1. A method for operating a data processing system to simulate a mixer having a known design, said mixer having an RF port, a LO port, and an IF port, said method comprising generating an estimate, b2, of the output signal leaving said IF port when an input signals a1, a2, and a3 are applied to said RF port, said IF port, and said LO port, respectively wherein, $$b2 = f(a1, a3) + S22 * a2$$

where:

S22 is a constant and, $$f(a1, a3) = \sum_{i=o}^{M} \sum_{j=o}^{N} C_{ij} * a1^i * a3^j$$

said coefficients $C_{ij}$ being contants that depend on said mixer design and wherein M and N are integers greater than 0.

2. The method of claim 1 wherein said coefficients $C_{ij}$ are determined by measuring a signal leaving said IF port when a1 and a3 are single tone signals.

3. The method of claim 1 wherein the coefficients $C_{ij}$ are determined by simulating said mixer on a non-linear circuit simulator and determining a signal leaving said IF port when a1 and a3 are single tone signals.

* * * * *